United States Patent [19]

Stanbery

[11] 4,322,571
[45] Mar. 30, 1982

[54] SOLAR CELLS AND METHODS FOR MANUFACTURE THEREOF

[75] Inventor: Billy J. Stanbery, Seattle, Wash.

[73] Assignee: The Boeing Company, Seattle, Wash.

[21] Appl. No.: 169,790

[22] Filed: Jul. 17, 1980

[51] Int. Cl.$^3$ .................... H01L 31/06; H01L 31/18
[52] U.S. Cl. .................... 136/255; 29/572;
148/187; 148/189; 156/648; 156/649; 156/662;
357/30; 204/15
[58] Field of Search .............. 148/186, 187, 189, 1.5;
29/572; 156/647, 648, 649, 657, 662; 136/255,
256; 357/30, 91, 88; 204/15

[56] References Cited

U.S. PATENT DOCUMENTS 4,029,518  6/1977  Matsutani et al. .............. 136/255
4,131,488 12/1978  Lesk et al. ...................... 148/1.5
4,252,865  2/1981  Gilbert et al. .................. 428/611

FOREIGN PATENT DOCUMENTS 1447410 8/1976 United Kingdom .............. 136/255

Primary Examiner—Aaron Weisstuch
Attorney, Agent, or Firm—Hughes, Barnard & Cassidy

[57] ABSTRACT

An improved light transducer such as a solar cell and, especially, a concentrator solar cell, together with processes for forming the same which permit the formation of improved light transducers characterized by their high thermal stability and by optimized impurity atom dispersion zones at the surface of either a p-type or an n-type substrate—such, for example, as a silicon substrate—defining: (i) a thermally stable deep junction with relatively high surface concentrations of dopant dispersed in those areas where metallic electrodes are to be formed, thus providing excellent ohmic contact characteristics in such areas; and (ii), an efficient energy conversion shallow junction with relatively lower surface concentrations of dopant in the inter-electrode photoactive regions of the cell, with such inter-electrode photoactive regions preferably being texturized, thereby optimizing current generation per unit of incident radiation and minimizing reflection losses. More particularly, a deep junction (on the order of 0.5 μm or greater) is first formed throughout the substrate's entire near-surface area which is to be exposed to incident radiation; such deep junction is then entirely removed in the inter-electrode regions of the substrate by subjecting such regions to an acid etch, preferably with a texturizing etchant but, in some instances, with a polish etchant; and, a relatively uniform shallow junction (on the order of 0.3 μm±0.1 μm) is then formed in the etched inter-electrode near-surface regions either (i) by subjection of the substrate to a gas diffusion dopant process, or (ii), by conventional ion implantation techniques.

64 Claims, 18 Drawing Figures

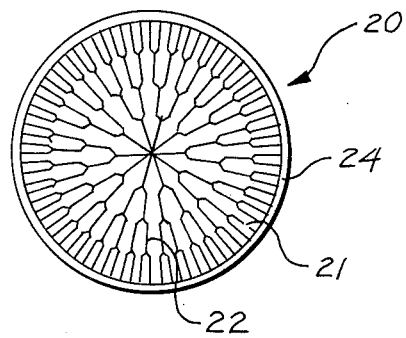
FIG. 1
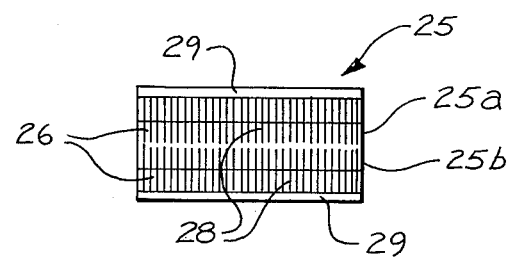
FIG. 2
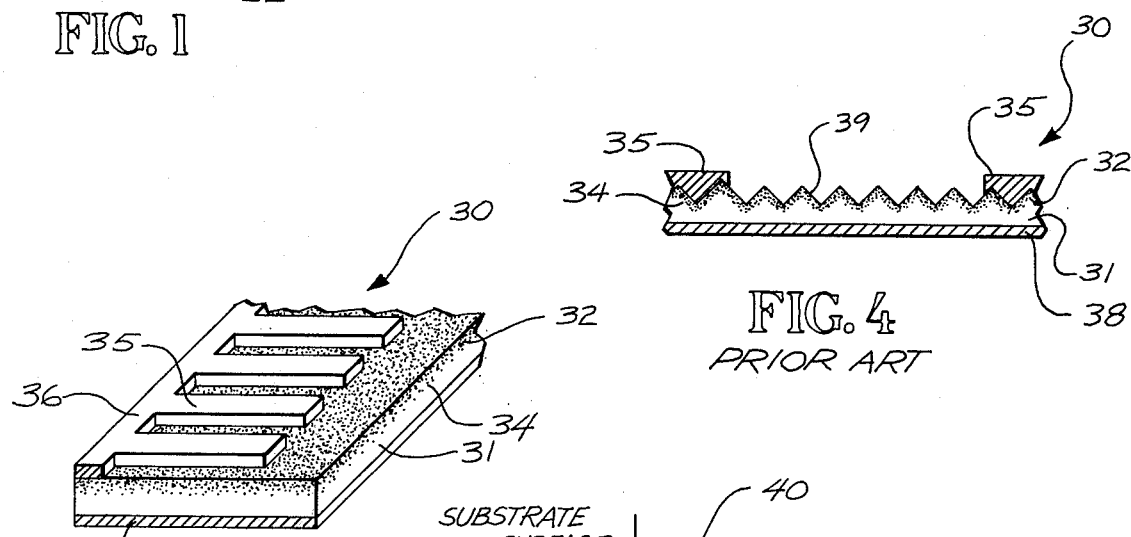
FIG. 3
PRIOR ART
FIG. 4
PRIOR ART
FIG. 5
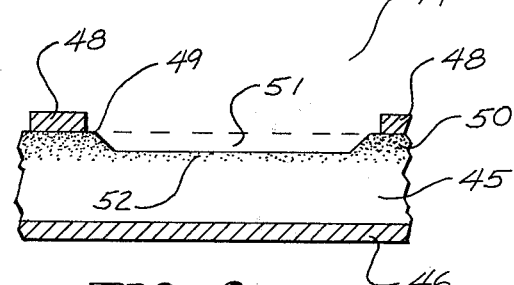
FIG. 6
PRIOR ART
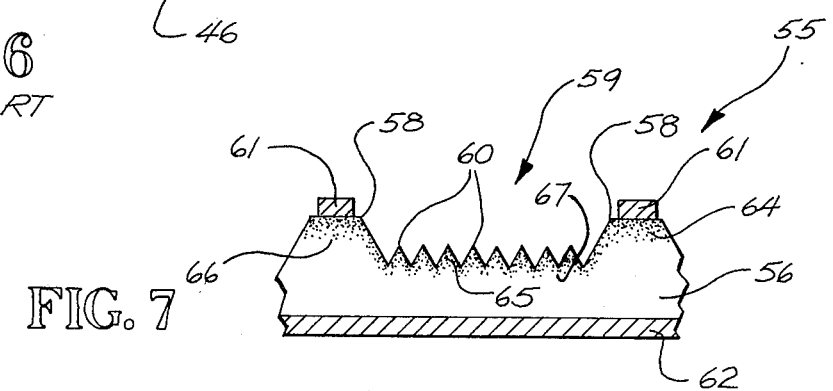
FIG. 7

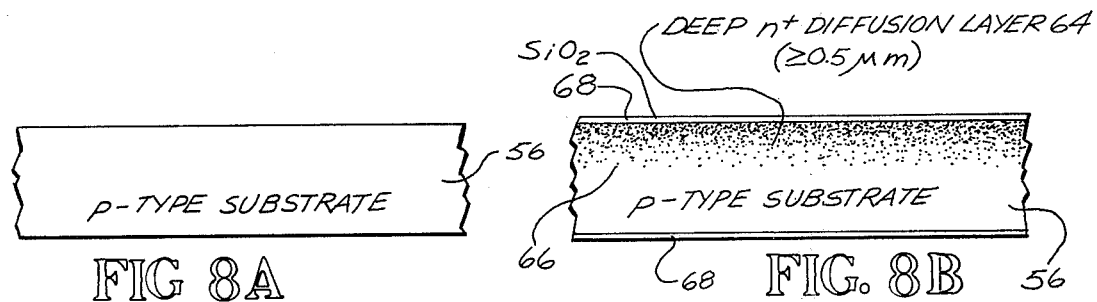
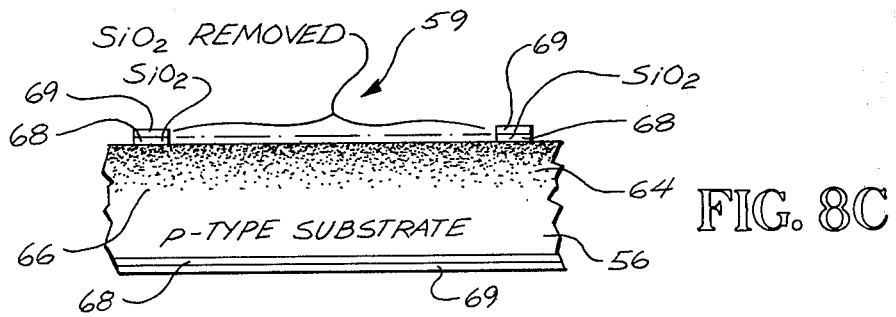
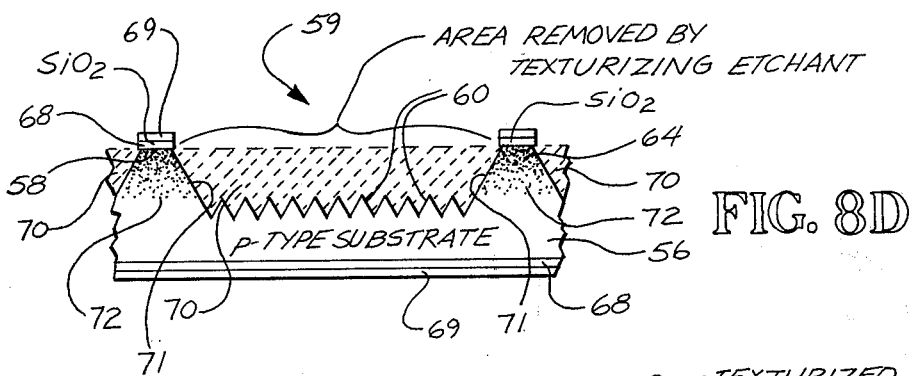
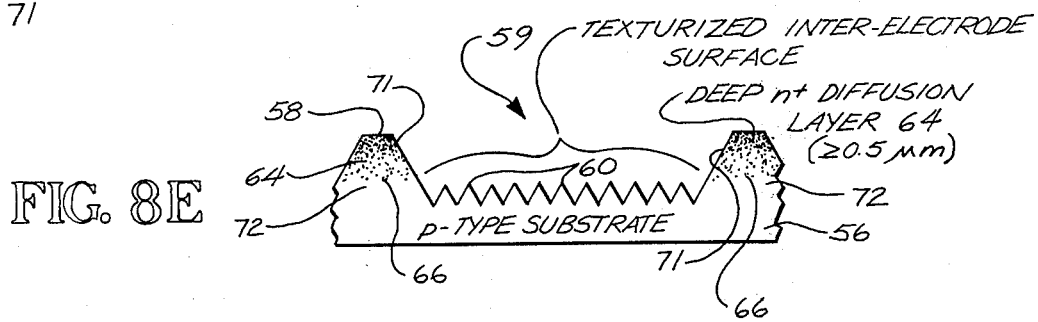
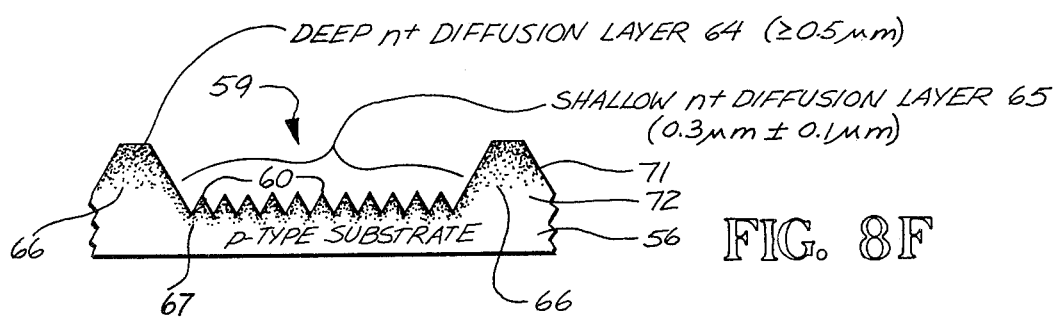

(700x)

(3000x)

SOLAR CELLS AND METHODS FOR MANUFACTURE THEREOF

RELATED APPLICATION

Rudolph E. Corwin, Dietrich E. Reimer and Billy J. Stanberry, Ser. No. 169,756, filed July 17, 1980, for "Improved Electrodes For Light Transducers Such As Solar Cells And Concentrator Solar Cells, And Methods For Manufacture Thereof."

BACKGROUND OF THE INVENTION

The present invention relates generally to solar cells and/or other light-to-electrical energy transducers; and, more particularly, to solar cells—especially, concentrator solar cells—and to methods of manufacture thereof, characterized in that the cells have (i) a relatively deep $n^+ - p$ or $p^+ - n$ junction (on the order of 0.5 $\mu$m or greater) with high surface concentrations of dopant in the near-surface regions where electrodes are to be formed by, for example, vacuum deposition and/or plating techniques, and (ii), a relatively shallow junction (on the order of 0.3 $\mu$m ± 0.1 $\mu$m) in the inter-electrode near-surface regions defining the cell's photoactive regions, which inter-electrode regions are preferably texturized; thereby providing cells characterized by: (a) their low resistance and excellent ohmic contact properties immediately adjacent the electrodes; (b) high current generating and low reflective loss properties in the photoactive regions of the cell; and (c), relatively high thermal stability.

One of the more perplexing problems faced by designers, manufacturers and users of light-to-electrical energy transducers such as solar cells and concentrator solar cells has, for a number of years, been, and continues today to be, the need to improve both the light energy collection efficiency and the conversion efficiency of light to electrical energy. In this connection, it has long been recognized that light reflected from the face of a solar cell is a principal source of poor light collection efficiency, and many efforts have been made, and are continuing to be made, to solve this problem. Initially, such efforts were primarily directed towards providing a thin, non-reflective, transparent barrier layer; but, such non-reflective barrier layers, of and by themselves, have not provided a satisfactory solution to the problem. Other efforts have included deformation of the photoactive face of the cell itself so as to form a multi-faceted photoactive face wherein light is reflected from one facet to another so as to improve collection efficiency. Typical examples of this latter approach are suggested in Lamb U.S. Pat. No. 2,320,185 (wherein a photosensitive oxide layer is applied to an irregular, die stamped, copper blank or, wherein a photosensitive selenium layer is subjected to pressing to form a multi-faceted surface); and, in Rudenberg et al U.S. Pat. No. 3,150,999 (wherein a block of semiconductor material—e.g., silicon—is placed in a "waffle iron" type die and subjected to ultrasonic vibration). Rudenberg et al also suggest that the desired multi-faceted faces can be obtained by etching.

In addition to the etching suggestion contained in the aforesaid Rudenberg et al patent, there has been a wealth of work in the area of etchants and etching processes to form a "texturized" surface on a photocell substrate—viz., a surface characterized by randomly located irregularities (commonly pyramidal in shape) defining light absorptive surfaces having reflecting facets to improve collection efficiencies. For example, in McKelvey et al Canadian Pat. No. 751,084 (1967), the patentees disclose a process for forming a texturized photoactive surface on an n-type substrate by first etching the surface with an aqueous hydroxide solution—e.g., sodium hydroxide or potassium hydroxide. Thereafter, the textured surface has a diffused layer of impurity atoms formed therein in a conventional manner; such diffusion layer defining a $p^+ - n$ junction stated to be about "one micron" (1.0 $\mu$m) in thickness. Following formation of the diffused layer, the patentees apply a first ohmic contact directly to the texturized surface and a second ohmic contact on the back of the n-type substrate. See, also, Bailey et al U.S. Pat. No. 4,137,123 which discloses a surface etchant for silicon comprising an anisotropic etchant for producing a texturized surface defined by a random distribution of minute pyramids.

Rittner U.S. Pat. No. 4,135,950 discloses an arrangement for forming V-shaped grooves having a depth of 320 $\mu$m and a width of 416 $\mu$m by first masking a p-type silicon substrate to preclude formation of a multiplicity of randon pyramids and then etching the unmasked surface with hydrazine. Thereafter, a thin n-type layer is diffused into the V-shaped grooved surface and electrodes are applied to the mesa-like peaks between adjacent grooves. Thus, the arrangement is such that the hydrazine etching process is controlled by masking to preclude the formation of a texturized surface defined by a multiplicity of randomly located pyramids while permitting the formation of a plurality of elongate, parallel, deep V-shaped grooves.

The concept of masking the substrate and thereafter preferentially etching the unmasked surface to produce a "texturized" photoactive surface is one that has been conventionally disclosed and used in the prior art. For example, such an arrangement is disclosed in an article entitled "Total Photon Absorption Solar Cells" by J. J. Cuomo and L. Kuhn, IBM Technical Disclosure Bulletin, Vol. 18, No. Aug. 3, 1975, as well as in Magee et al U.S. Pat. No. 4,147,564, see, esp., Magee et al FIGS. 4A and 4B.

Other representative prior art patents of miscellaneous interest include, for example: Gereth et al. U.S. Pat. No. 3,686,036; Chiang et al U.S. Pat. No. 4,133,698; Avery et al. U.S. Pat. No. 4,158,591; Longshore U.S. Pat. No. 4,160,045; and, Bube U.S. Pat. No. 4,163,678—although such patents do not relate to the particular double or two step diffusion process with an intermediate etch to entirely remove selected portions of the deep diffusion zone as employed with the present invention.

In general, the specific types of dopant employed in a diffusion process or, indeed, the particular process employed for dispersing impurity atoms into the near-surface regions of a substrate, can vary widely dependent upon such factors as, merely by way of example: the material from which the substrate is formed—e.g., silicon, selenium, or other well-known materials; whether the substrate is a p-type or an n-type material; whether the impurity atoms are to be, e.g., phosphorous, boron, arsenic, antimony, etc,; the depth of the junction to be formed; whether a conventional gas diffusion process is to be employed to disperse or diffuse impurity atoms in the substrate, or whether an ion implantation process is to be employed wherein impurity atoms are dispersed in the substrate by ion bombardment; etc. However, irrespective of the particular process employed, it has generally been known that it is desirable to form a deep junction—preferably on the order of 0.5 $\mu$m, or greater, in depth—with high surface concentrations of dopant in the regions immediately beneath the surface electrodes so as to insure good ohmic contact. At the same time, it is also known that optimized current generation in the photoactive region of the solar cell mandates the formation of a relatively shallow junction—preferably on the order of only 0.3 $\mu$m±0.1 $\mu$m in thickness—having lower surface concentrations of dopant, with the shallow junction preferably being formed on a texturized surface of the type disclosed, for example, in the aforesaid Rudenberg et al, McKelvey et al., Bailey et al. and Magee et al. patents and/or the Cuomo et al. article. Such disclosures, however, do not deal with, or even recognize the need for, differential diffusion depths and/or differential near-surface impurity concentration levels in the photoactive regions of the cells and in the regions under the exposed surface electrodes.

The concept of a solar cell having both deep and shallow junctions has, however, been disclosed in Matsutani et al. U.S. Pat. No. 4,029,518, as well as in Gonsiorawski U.S. Pat. No. 4,152,824. Matsutani et al. discloses two processes for obtaining the desired differing depth junctions. In the first process (FIG. No. 2 of Matsutani et al.), a mask is applied to the photoactive regions of the substrate and a diffusion process is employed to form a deep junction on the order of 3.0 $\mu$m only in the unmasked regions (i.e., the regions where the electrodes are to be formed). The mask is then removed and a shallower junction—e.g., about 0.5 $\mu$m—is formed in the photoactive regions of the substrate. Neither diffusion layer is formed on a texturized surface. Matsutani et al also disclose in FIG. No. 3 of their patent an arrangement in which the entire upper surface of the substrate has a deep junction—viz., 3.0 $\mu$m—formed therein and, thereafter, the photoactive regions are "slightly etched" (Col. 2, line 58) to partially remove the upper portion of the deep junction and to leave only the lower portion of the junction—i.e., the lower 0.5 $\mu$m is left—thereby creating a shallower junction where the deep junction has been etched. However, FIG. 3 of the patent illustrates a resulting cell in which the etched surface is planar, suggesting the use of a non-texturizing etchant to remove a portion, but not all, of the deep junction in the inter-electrode photoactive regions of the substrate.

In the Gonsiorawski patent, the patentee applies a doped SiO$_2$ layer to the substrate, etches the doped SiO$_2$ layer away only in those areas where electrodes are to be affixed, and then subjects the substrate with its doped SiO$_2$ mask to a deep diffusion process. As a result, a deep junction is formed in the substrate in those areas where the doped SiO$_2$ layer has been removed, while a shallow junction (said to be from 0.1 $\mu$m to about 0.5 $\mu$m) is formed in those regions under the doped SiO$_2$ mask. Such shallow doped regions are, of course, not texturized.

Consequently, insofar as presently known, while the prior art is replete with numerous proposed processes and techniques purported to improve light collection and/or conversion efficiencies, prior to the advent of the present invention there has been no known effective and reliable method for optimizing the diffusion properties in both the contact areas and the photogeneration areas of a light transducer substrate by formation of a deep junction with high surface concentrations of dopant in discrete, narrow, raised, mesa-like areas of the substrate suitable for application of fine-line electrodes by vacuum deposition and/or plating techniques, while forming a shallow junction, preferably on a textured surface, in the photoactive regions of the transducer.

Another problem that has continued to plague the industry has been that of providing light-to-electrical energy transducers such, for example, as solar cells and, especially, concentrator solar cells, which are characterized by their thermal stability—i.e., by their ability to be heated to very high temperatures for extended periods of time without catastrophic loss of output power. A typical instance where thermal stability is important is in those cases where the cell must be glass encapsulated to enhance environmental stability against corrosion, sandblasting, etc.; and, under such requirements, the cell must have sufficient thermal stability as to be capable of withstanding molten and/or semi-solid or soft glass at temperatures commonly ranging from 900° C. to 1000° C. during the glass encapsulation process. Another application where thermal stability is an important characteristic is in the area of space applications where solar cells are continuously exposed to high-energy solar particle fluxes which tend to degrade the crystalline perfection of the cell over a period of time and thereby reduce the cell's power output by factors ranging from 50% to 80%. While in-situ laser annealing has been found to restore a great deal of the crystallinity, such cells commonly suffer from shorting of the junction resulting from migration of electrode metals through the junction into the substrate, thereby rendering the cell virtually useless. Solar cells made in accordance with the present invention, however, permit of optimization of the requisite thermal stability characteristics by virtue of optimization of the junction characteristics in both (i) the inter-electrode photoactive regions of the cell and (ii), the contact regions of the cell; and, this desirable result can be achieved with cells having either texturized inter-electrode photoactive surfaces or polished inter-electrode photoactive surfaces.

SUMMARY OF THE INVENTION

Accordingly, it is a general aim of the present invention to provide improved light transducers such, for example, as solar cells—especially, concentrator solar cells—and improved methods for manufacture thereof, which overcome the foregoing disadvantages inherent with prior art light transducers and manufacturing processes and which permit optimization of both the contact and the photogeneration diffusion zones in such a transducer by formation of a deep junction with high surface concentrations of dopant in those discrete areas where electrodes are to be formed, thus providing excellent ohmic contact in such areas, yet wherein the photoactive regions of the transducer are characterized by a uniform shallow junction, preferably formed on a texturized surface, so as to optimize both the light collection and current generation efficiencies of the transducer as well as the thermal stability thereof.

In one of its important aspects, it is an object of the invention to provide a double or two-step impurity atom dispersion process for successively and independently forming deep and shallow junctions in selected near-surface discrete regions of a p-type or n-type substrate with an intermediate masked etching step—preferably with a texturizing etchant but, in some applications, with a polish etchant—whereby selected discrete regions of the previously formed deep junction are entirely removed so as to permit optimization of the shallow junction second dispersion layer for efficient light collection and current generation without consideration of the low resistance ohmic contact region formed during the first deep dispersion step.

In another of its important aspects—one particularly advantageous in the formation of cells having a p-type substrate and an n+ diffusion layer defining an n+—p junction—it is an object of the invention to provide improved processes for forming a light transducer such as a solar cell, and improved transducers produced thereby, which permit the use of relatively low grade substrate materials, yet wherein the undesired impurities and/or dislocations contained in such low grade substrate materials are gettered to the near-surface substrate regions during a high temperature diffusion process—for example, at temperatures at or in excess of 950° C.—used to form a deep junction, with such undesired impurities and/or dislocations and the deep junction then being entirely removed in those photoactive areas of the cell to be used for light absorption and current generation, thereby significantly upgrading the quality of the substrate in such areas and permitting the application of a uniform, shallow n+ impurity atom dispersion layer in the near surface inter-electrode photoactive regions of the cell. As a result of attaining this objective, significant savings in raw material costs can be realized by using low grade substrate materials; yet, the performance characteristics of the finished transducer are greatly improved.

In this connection, it is an ancillary object of the invention to provide improved processes for forming light transducers having n+—p junctions wherein the process utilized to entirely remove selected discrete regions of the deep junction (together with the undesired gettered impurities and/or disclocations contained therein) serves to texturize the inter-electrode regions of the substrate, thus permitting the formation of relatively uniform depth shallow junctions in such inter-electrode regions on a texturized surface so as to significantly improve light collection efficiencies and wherein the differing depth junctions are optimized to provide low resistance, good ohmic contact at the substrate/electrode interfaces, and excellent light collection and current generation properties in the inter-electrode photoactive regions.

Another object of the invention is the provision of an improved process for forming differential depth junctions in a solar cell or the like which permits the use of relatively high temperature gas diffusion processes to form deep junctions with high surface concentration of dopants providing good ohmic contact in the regions of the substrate to which electrodes are to be applied, yet which permits the formation of shallow junctions having highly controllable surface concentrations and/or concentration profiles in the current generating photoactive regions of the substrate by means of conventional ion implantation techniques; or, alternatively, which permits the formation of inter-electrode shallow junctions by means of conventional gas diffusion techniques in those instances where desired. In either case, the resulting solar cell is characterized by its high thermal stability in the areas of the deep junctions and by its efficiency in light-to-electrical energy conversion in the areas of the shallow junctions.

DESCRIPTION OF THE DRAWINGS

These and other objects and advantages of the present invention will become more readily apparent upon reading the following detailed description and upon reference to the attached drawings, in which:

FIG. 1 is a highly diagrammatic plan view, somewhat enlarged in scale, here depicting a light transducer—e.g., a concentrator solar cell—embodying the features of the present invention with the current collecting electrodes here being fragmentarily illustrated in highly exaggerated spread form, it being understood that in actuality the electrodes would appear as relatively closely spaced, fine, generally radial lines;

FIG. 2 is a plan view similar to FIG. 1, but here illustrating a modified type of concentrator solar cell—indeed, two separate, independent solar cells formed on a single substrate with each cell having a generally rectangular configuration and a plurality of parallel, closely spaced, fine-line electrodes;

FIG. 3 is a fragmentary, highly diagrammatic sectional view of a portion of a conventional prior art solar cell with the dimensional relationships being illustrated in exaggerated form for purposes of clarity, it being understood that such a solar cell would normally have a wafer-like thickness with substrate thickness, electrode dimensions, and diffusion layer depths generally being measured in microns or fractions of microns;

FIG. 4 is a greatly enlarged sectional view of a conventional solar cell with the cell components being illustrated in dimensionally exaggerated form for purposes of clarity, the conventional cell here comprising a cell having a texturized surface is not only the inter-electrode photoactive regions where such a surface is desired but, also, in the contact areas beneath the electrodes, thus making it difficult to apply electrodes to the cell;

FIG. 5 is a graphic representation depicting typical deep and shallow junction concentration profiles in an n+ diffusion layer formed in the near-surface region of a p-type substrate, with substrate and diffusion layer depths being illustrated on the ordinate and n-dopant concentrations on the abscissa;

FIG. 6 is a fragmentary sectional view similar to FIG. 5, but here illustrating a conventional solar cell having a relatively deep junction formed on the surface of the substrate with that portion of the deep junction in the inter-electrode region subsequently being partially etched away (as indicated in phantom) so as to form a cell having both deep and shallow junctions, yet which have been formed utilizing a single diffusion process;

FIG. 7 is a fragmentary sectional view similar to FIGS. 5 and 6, but here illustrating in highly diagrammatic form a solar cell made in accordance with the present invention and comprising a substrate having discrete, narrow, raised mesa-like contact areas with a respectively deep diffusion layer and texturized inter-electrode photoactive regions with a relatively shallow uniform depth diffusion layer;

FIGS. 8A through 8I are fragmentary, highly diagrammatic sectional views (with dimensional relationships depicted in exaggerated form for purposes of clarity) and illustrating in step-wise fashion the successive stages in the manufacturing process for forming, e.g., the exemplary solar cell shown in FIG. 7; and, more particularly;

FIG. 8A is a fragmentary sectional view of a p-type substrate suitable for usage in the present invention and comprising, for example, p-type silicon;

FIG. 8B is a fragmentary sectional view diagrammatically illustrating the condition of the substrate following a conventional high temperature, deep diffusion process in which a relatively deep n+ diffusion layer (e.g., on the order of 0.5 μm or greater) has been formed in the near-surface region of the substrate and, illustrating also the SiO₂ coatings formed incident to the high temperature diffusion process;

FIG. 8C is a fragmentary sectional view similar to FIG. 8B, but here illustrating the substrate during the course of a conventional high resolution photolithographic technique utilized to remove the SiO₂ coating in selected discrete areas while leaving the SiO₂ coating in those discrete areas comprising the contact areas of the solar cell;

FIG. 8D is a fragmentary sectional view illustrating particularly the texturizing step of a process embodying the present invention wherein the deep junction previously formed is entirely removed from the inter-electrode regions of the substrate by a texturizing etchant, while leaving the deep junction intact and unaffected in the contact areas beneath the SiO₂ mask;

FIG. 8E is a fragmentary sectional view similar to FIG. 8D illustrating the p-type substrate (i) following the texturizing process and after removal of the SiO₂ mask with the substrate here characterized by contact areas defining raised mesa-like surfaces for the application of electrodes with a deep junction diffusion layer formed in such contact areas, but (ii) prior to formation of a shallow junction in the texturized, near-surface inter-electrode regions;

FIG. 8F is a fragmentary sectional view similar to FIG. 8E, but here illustrating the substrate following formation of a shallow junction (e.g., on the order of 0.3 μm±0.1 μm) in the near-surface photoactive regions of the texturized inter-electrode areas of the substrate;

FIG. 8G is a fragmentary sectional view similar to FIG. 8F, but here illustrating the cell following application of a metallic back contact to the undersurface of the substrate;

FIG. 8H is a fragmentary sectional view similar to FIG. 8G, but here illustrating the cell following vacuum deposition of fine-line metallic electrodes on the raised mesa-like contact areas of the substrate;

FIG. 8I is a fragmentary sectional view illustrating a solar cell embodying the features of the present invention following the application of a silver plate to the vacuum deposited metallic electrodes;

Figure 8G:
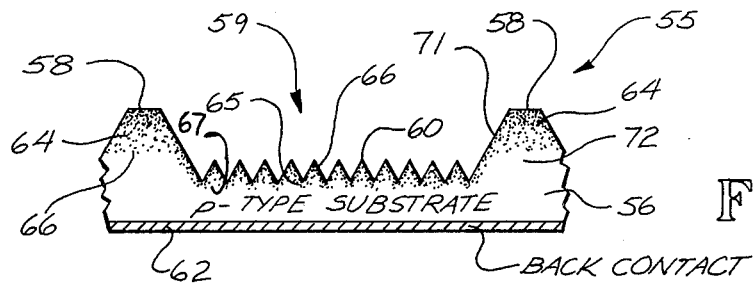

While the invention is susceptible of various modifications and alternative forms, specific embodiments thereof have been shown by way of example in the drawings and will herein be described in detail. It should be understood, however, that it is not intended to limit the invention to the particular forms disclosed but, on the contrary, the intention is to cover all modifications, equivalents and alternatives falling within the spirit and scope of the invention as expressed in the appended claims.

DETAILED DESCRIPTION

Turning now to FIG. 1, an exemplary concentrator solar cell, generally indicated at 20, embodying the features of the present invention has been diagrammatically illustrated. As here shown, the cell 20 (which, in actual size, might commonly be on the order of approximately 2.0" in diameter) comprises a photoactive, light absorbing, current generating surface 21 formed on a suitable wafer-like semiconductor substrate such, for example, as silicon and upon which are formed a plurality of generally radial, fine-line electrodes 22 and a peripherally disposed current collecting electrode 24. Conventionally, the wafer-like semiconductor substrate may range in thickness from, for example, 125 μm to 400 μm. A somewhat structurally modified, but functionally identical, exemplary concentrator solar cell, generally indicated at 25, has been illustrated in FIG. 2. In this instance, the cell 25 actually comprises a pair of generally rectangular, electrically independent cells 25a and 25b (which each might conventionally be on the order of approximately 1"×0.375") having photoactive, light absorbing, current generating surfaces 26 upon which are formed a plurality of closely spaced, parallel, fine-line electrodes 28 and a current collecting electrode 29. As here shown, the parallel electrodes 28 for the two independent solar cell segments 25a, 25b extend towards, but terminate short of, one another; thus permitting the cell segments 25a, 25b to be physically separated along a centrally disposed score line (not shown) formed in the substrate of cell 25.

Those skilled in the art will readily appreciate that solar cells such as the exemplary cells 20, 25, as thus far briefly described, are quite conventional, at least insofar as the physical arrangement of the exemplary electrode layouts on photoactive surfaces are concerned. Of course, the electrodes as physically illustrated in both FIGS. 1 and 2 are shown in considerably exaggerated form for purposes of clarity and would commonly comprise extremely fine-line, vacuum deposited electrodes on the order of 0.5 mils to 1.0 mils in width; with such electrodes being spaced apart by discrete exposed photoactive regions 21 (FIG. 1) and 26 (FIG. 2) having a width on the order of, on average, about ten times the width of the electrodes—viz., from 5.0 mils to 10.0 mils, on average. That is, in the design of solar cells of the type here illustrated, it is highly desirable to maximize the amount of cell area comprising exposed photoactive material so as to maximize light absorption and current generation. On the other hand, it is essential that sufficient electrode area be provided to permit collection and conduction of generated current. Consequently, optimized relative percentages of electrode area and photoactive area may vary from cell to cell dependent upon the specific application(s) to which the cell is to be put; but, with concentrator solar cells of the type here illustrated by way of example, it is not unusual to encounter arrangements wherein, on average, approximately 90% of the total cell surface area, comprises exposed photoactive regions, with the remaining 10% of the cell area being "masked" from incident radiation by vacuum deposited, fine-line electrodes.

Thus, referring to FIG. 3, a conventional prior art solar cell, generally indicated at 30, has been illustrated; such cell comprising an n-type silicon substrate 31 having a p+ diffusion layer 32 defining a p+ —n junction 34 formed at the interface of the p+ diffusion layer 32 and the n-type silicon substrate 31. In this illustrative prior art device, described more fully in the aforesaid Canadian Pat. No. 751,084 (1967), the p+ diffusion layer 32 is said to be preferably formed by gas diffusion of boron particles into the near-surface regions of the substrate at surface concentrations on the order of $10^{21}$ atoms per cubic centimeter. Those skilled in the art will, of course, readily appreciate that the p+ —n junction 34 actually comprises the interface between two regions of different chemical potential—viz., the n-type silicon substrate 31 and the p+ diffusion layer 32—and, consequently, serves to convert incident radiation in the form of absorbed light photons into a difference in electrical potential, thus generating current. Such generated current is conducted by a first ohmic contact in the form of a series of closely spaced parallel electrodes 35 and a suitable current collection electrode 36. As is conventional, the illustrative solar cell 30 includes a second ohmic contact 38 formed on the rear or bottom surface of the cell, thereby permitting suitable electrical leads (not shown) to be attached to the contacts 36, 38 for deriving power output from the cell when exposed to incident radiation.

In the exemplary prior art device depicted in FIG. 3 and described in greater detail in the aforesaid Canadian Pat. No. 751,084 (1967), the patentees preferably texturize the entire surface of the n-type silicon substrate 31 by preferential etching prior to forming the p+ diffusion layer 32 by gas diffusion with a boron dopant. Thus, as indicated in greatly exaggerated form in FIG. 4, preferential etching of the substrate 31 with an aqueous solution of sodium or potassium hydroxide produces a series of etched, prism-like facets 39 which, in the exemplary cross-sectional configuration depicted, appear to be generally triangular in shape but which are, in actuality, pyramidal in shape. According to the patentees, the texturized surface comprises a multiplicity of overlapping or slightly spaced "pits" which range from about 1 $\mu$m to about 10 $\mu$m in depth and which have a maximum width at their base of about 30 $\mu$m or less. Following such texturization, the conventional solar cell 30 is then subjected to a gas diffusion process to form the p+ diffusion layer 32 (said in the patent to be about 1.0 $\mu$m in thickness) and the p+ —n junction 34. At this point in a typical manufacturing process, the texturized doped substrate would be masked and the electrodes 35, 36 would be formed on the "pitted" or texturized surface 39, presumably by a sophisticated, but completely conventional, high resolution photolithographic technique. However, because of the pitted nature of the texturized surface, it is quite difficult to achieve the requisite successive mask alignments generally required; and, moreover, the quality of the bond between the electrodes and the texturized surface is not optimized. Indeed, as indicated in FIG. 4, attempts to form electrodes 35 on the highly irregular, texturized or pitted surface 39 on the substrate 31 inherently result in electrode metals being deposited within the valleys between the etched prism-like facets 39. Those skilled in the art will, of course, appreciate that where the diffusion layer 32 defines a shallow junction—say, for example, 0.3 $\mu$m$\pm$0.1 $\mu$m—the fact that it is difficult to maintain precise control over the electrode deposition process can result, and often has resulted, in electrode metals migrating entirely through the junction, thereby producing a short circuit and destroying the cell. And, in any event, deposition of electrode metals on a texturized surface results in significant degradation of the thermal stability characteristics of such cells. A further disadvantage of this general type of prior art cell is the fact that while the texturized surface does serve to increase light collection efficiency, no provision is made for optimizing light-to-electrical energy conversion efficiency in the photoactive diffusion zone 32 vis-a-vis conductivity characteristics in that portion of the diffusion zone 32 in the contact area defined by the electrodes 35, 36.

Reference to FIG. 5 may, at this point, facilitate a thorough understanding of the present invention. Dispersion of impurities within the near-surface regions of a semiconductor substrate (such, for example, as silicon) can be achieved in a variety of conventional ways. Gas diffusion at relatively high temperatures and, more recently, ion implantation, are two well-known ways of achieving the desired result; although gas diffusion is the technique most commonly employed. Assuming, merely by way of example, that one wishes to disperse an n-type dopant—e.g., phosphorous in a gaseous carrier—into a p-type silicon substrate to form an n+ diffusion layer and an n+ —p junction, a typical deep diffusion process might commonly be conducted for a period on the order of from about 15 to about 20 minutes at a temperature in the range of about 950° C. to about 1000° C. This process typically produces a phosphorous impurity concentration profile such as diagrammatically illustrated at 41 in FIG. 5—viz., relatively high concentrations of n-dopant impurity atoms at the surface 40 of the substrate and in the near-surface regions, with concentration rapidly decreasing with depth. Thus, a deep diffusion process would typically produce a concentration profile such as indicated at 41 in FIG. 5 having maximum dopant concentrations at and near the surface, and essentially zero dopant concentration below the junction, or interface, between the n+ diffusion layer and the substrate, such deep junction commonly being on the order of 0.5 $\mu$m, or greater, for a typical concentrator solar cell.

While such deep junctions with high surface concentrations of dopant are essential to good ohmic contact at the interface between the substrate and a superimposed electrode, deep junctions are known to be undesirable in the photoactive current generating regions of a cell. Thus, a typical solar cell—especially, a concentrator solar cell—desirably has a shallow junction having a considerably lower surface concentration of dopant impurity atoms in the diffusion layer with a concentration profile such as illustrated, by way of example, at 42 in FIG. 5, thereby permitting more current to be generated per unit of absorbed incident radiation. A typical shallow n+ —p junction for use in concentrator solar cells might, under optimum conditions, preferably be on the order of 0.3 $\mu$m$\pm$0.1 $\mu$m in depth and might be formed by gas diffusion at temperatures in the range of about 850° C. to about 875° C. for periods of from only about 10 to about 15 minutes. As a result of these inconsistent—indeed, conflicting—design and operational parameters, most conventional solar cells—e.g., the typical conventional cell shown in FIGS. 3 and 4—represent compromises which can permit optimization of one or the other, but not both, of the diffusion zones in either the contact region or the photoactive current generating region.

Because of these conflicting requisites with respect to optimization of diffusion zone characteristics in differing regions of a solar cell, efforts have heretofore been made to devise processes for forming differing depth diffusion zones in solar cell substrates. As previously indicated, two such approaches are described in FIGS. 2 and 3 of the aforesaid Matsutani et al. U.S. Pat. No. 4,029,518. In one approach (Matsutani et al. FIG. 2): (i) the photoactive regions of the substrate are masked; (ii) the substrate is subjected to a first deep diffusion process forming a deep junction on the order of 3.0 $\mu$m; (iii) the mask is then removed; and (iv), a second shallower junction on the order of 0.5 $\mu$m is then formed in the photoactive regions. The second approach is illustrated herein in FIG. 6 wherein a Matsutani et al type solar cell is generally indicated at 44. Thus, as here shown the cell 44 comprises an n-type silicon semiconductor wafer or substrate 45 having (i) a back electrode 46 and (ii), a plurality of current collection electrodes 48 disposed on the photoactive face 49 of the cell. Prior to application of the electrodes, the substrate is subjected to a gas diffusion doping process to form a deep p+ diffusion layer 50 said to be 3.0 $\mu$m in thickness and extending uniformly over the entire surface of the substrate 45—viz., in the contact areas and in the inter-contact areas. Thereafter, a mask is formed on the doped surface of the substrate in the contact areas with the inter-contact, or inter-electrode, areas being unmasked. The thus masked substrate is then ". . . slightly etched to a thickness of, for example, 0.5 $\mu$m . . . " (Col. 2, 11. 58–59)—i.e., approximately 83% of the deep diffusion zone 50 in the inter-electrode photoactive regions (including the near-surface region of the deep diffusion layer where dopant concentrations are high) is etched away leaving only the lowermost approximately 17% of the deep diffusion zone 50 where dopant concentrations are comparatively lower. Thus, as indicated in FIG. 6, that area of the deep diffusion zone 50 beneath the broken line and indicated generally at 51 is etched away to a depth of about 2.5 $\mu$m, thereby leaving a shallower diffusion zone 52 having a smooth, planar, nontexturized or polish-etched surface in the photoactive inter-electrode regions of the cell 44.

Thus, while Matsutani et al. does disclose processes purported to permit optimization of the different diffusion zone characteristics in the contact areas vis-a-vis the photoactive areas of a solar cell, light collection efficiencies remain unaltered absent the provision of non-reflective coatings or barrier layers which, in any event, are known to produce unsatisfactory results. Moreover, the Matsutani et al. processes are simply not suitable nor compatible for use with texturizing etchants since a texturizing etchant would inherently produce a shallower junction 52 (FIG. 6) of non-uniform depth; and, moreover, were a texturizing etchant employed that resulted in a shallow junction of, for example, 0.3 $\mu$m±0.1 $\mu$m at the peak of a pyramid, of necessity the deep diffusion zone 50 would undoubtedly be entirely etched away at numerous random locations where the deeper pyramids are formed, thus eliminating the p+—n junction in such areas, significantly increasing the danger of short circuits, and significantly decreasing the life of the cell.

In accordance with one of the important aspects of the present invention, there has been provided an improved process for forming light transducers such, for example, as solar cells and, especially, concentrator solar cells, and improved light transducers formed thereby, characterized in that the depth of the junction can be readily and effectively optimized in both the contact areas and in the photoactive areas of the transducer notwithstanding the differing depths and concentration levels required; yet, wherein the beneficial results from (i) gettering of impurities and dislocations and/or (ii), texturization of the photoactive surface of the cell, can also be achieved. Thus, referring to FIG. 7, there has been illustrated an improved light transducer, generally indicated at 55—here, an exemplary concentrator solar cell—made in accordance with, and embodying features of, the present invention. Simply for purposes of clarity and facilitating an understanding of the invention, the various compounds and/or regions of the exemplary light transducer 55 have been illustrated in highly diagrammatic and dimensionally exaggerated and disproportionate relation. The illustrative transducer 55 here comprises a wafer-like semiconductor substrate 56 which can be either a p-type or an n-type substrate having a plurality of raised, spaced, mesa-like contact areas 58 and intermediate photoactive areas, generally indicated at 59, which have preferably been texturized to form a multiplicity of closely spaced, randomly located, randomly sized, minute pyramids 60, as best illustrated in the highly magnified (3000X) microphotograph reproduced as FIG. 10. While such pyramids are randomly sized, they are, on average, about 10 $\mu$m in height. The contact areas 58 are preferably raised mesa-like areas dimensioned to accommodate deposition of fine-line electrodes 61—e.g., electrodes on the order of about 0.5 mils to about 1.0 mil in width—by means of conventional high resolution photolithographic techniques. A back electrode 62 is applied to the surface of the substrate 56 remote from the photoactive surface 59 and the fine-line electrodes 61.

In keeping with the invention, the exemplary transducer 55 is preferably formed with: (i), a relatively deep impurity atom dispersion layer 64 in the contact areas 58; and (ii), a relatively shallow impurity atom dispersion layer 65 in the inter-electrode photoactive regions 59 of the cell. Preferably such shallow impurity atom dispersion layer 65 is of essentially uniform depth throughout the entire photoactive region 59 notwithstanding the presence of a highly irregular texturized surface defined by a multiplicity of minute, different sized pyramids 60 (Cf., FIG. 10); such shallow layer 65 preferably being on the order of about 0.3 $\mu$m±0.1 $\mu$m. The deep impurity atom dispersion layer 64 is preferably on the order of 0.5 $\mu$m, or greater, in depth.

Those skilled in the art will, of course, readily appreciate that where the substrate 56 comprises an n-type substrate, a p-type dopant such, for example, as boron would be employed; and, hence, the impurity atom dispersion layers 64, 65 would comprise p+ layers defining a deep p+—n junction 66 at the interface between the layer 64 and the substrate 56 and a shallow p+—n junction 67 at the interface between the layer 65 and the substrate. Conversely, in those instances where the substrate 56 comprises a p-type silicon substrate or the like, an n-type dopant such, for example, as phosphorous would be employed; and, hence, the layers 64, 65 would comprise n+ layers defining n+—p junctions 66, 67 at the interfaces between the layers 64, 65, respectively, and the substrate 56. Merely for convenience, and not by way of limitation, the ensuing description will assume that the substrate 56 comprises a p-type silicon semiconductor wafer; while the impurity atom dispersion layers, both deep 64 and shallow 65, are formed with an n-type dopant such, for example, as phosphorous in a conventional gas diffusion doping process.

Referring now to FIGS. 8A through 8I in seriatim order, there has been illustrated, and will hereinbelow be described, a typical step-by-step process embodying features of the present invention for forming a light transducer such, for example, as a concentrator solar cell of the type depicted at 55 in FIG. 7. As here shown, a p-type silicon semiconductor wafer, or substrate 56 (FIG. 8A), is first subjected to a conventional deep diffusion doping process to form a generally uniform depth n+ deep diffusion layer 64, preferably on the order of 0.5 μm, or greater, in depth (FIG. 8B) and defining a deep n+—p junction 66 at the interface between the deep diffusion layer and the substrate, with the deep diffusion layer 64 extending uniformly throughout the entire area of the substrate and with the relative concentration level of n-dopant impurity atoms being considerably greater in the near-surface regions and rapidly decreasing to unity at the junction 66 (Cf., FIG. 5). Such a deep diffusion process preferably involves subjection of the substrate 56 to diffusion of an n-type dopant (such, for example, as phosphorous) from a gaseous carrier at relatively high temperature levels—e.g., temperatures on the order of from about 950° C. to about 1000° C.—for a period of from about 15 minutes to about 20 minutes. During the course of such deep diffusion process, $SiO_2$ barrier layers 68 are formed on the exposed upper and lower surfaces of the doped substrate and such $SiO_2$ barrier layers 68 are preferably used as a mask during subsequent high resolution photolithographic process steps.

In carrying out one aspect of the present invention, the substrate 56 with its uniform depth, area-wide n+ diffusion layer 64 is now masked in selected areas only and is preferably subjected to a texturizing step employing conventional, high-resolution photolithographic techniques well known to those skilled in the art and which, therefore, are not herein described in detail. Briefly, however, and as best illustrated in FIG. 8C, a mask 69 is applied on the $SiO_2$ layer covering the entire underside or bottom surface of the substrate 56 and, in addition, on those selected areas on the uppermost $SiO_2$ layer 68 coincident with the desired contact areas 58 (Cf., FIGS. 7 and 8C). Therefore, the uppermost $SiO_2$ layer 68 formed during the deep diffusion process (FIG. 8B) is selectively removed from only those areas to be texturized—i.e., the inter-electrode, light absorbing, photoactive regions 59 which are not covered by mask 69—while the contact areas 58 remain masked by those areas of the $SiO_2$ layer 68 which are not removed. Such selected removal of the unmasked portions of the uppermost $SiO_2$ layer in the inter-electrode regions 59 (FIG. 8C) may be accomplished in any conventional manner well known to those skilled in the art such, for example, as the use of a buffered hydrofluoric acid solution.

Figure 10:
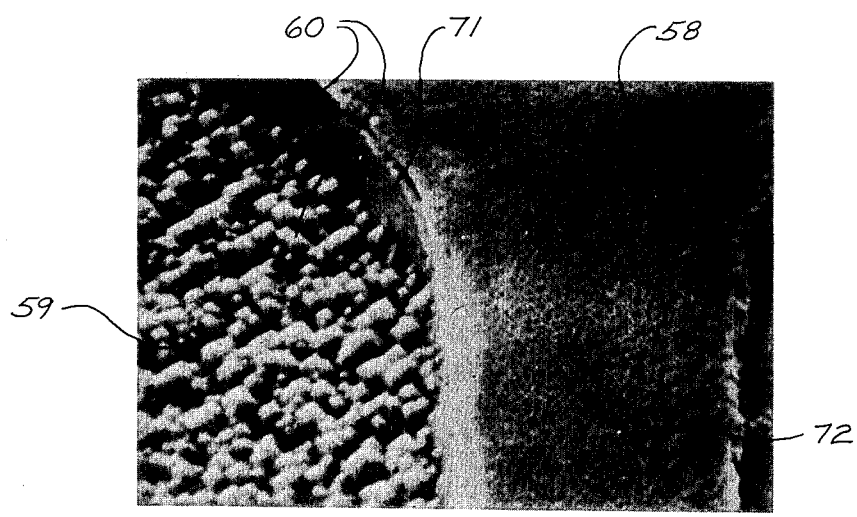

The masked substrate 56 is then preferentially etched in the unmasked regions 59 (from which the $SiO_2$ layer has been removed) utilizing a suitable conventional texturizing etchant such, for example, as hydrazine hydrate. Excellent results have been achieved using a texturizing etchant solution comprising 40% $H_2O$ and 60% hydrazine hydrate at a temperature of 90° C. However, other well known texturizing etchants may be used such, for example, as a potassium hydroxide solution of the types disclosed in the aforesaid Bailey et al. U.S. Pat. No. 4,137,123 and/or the aforesaid McKelvey et al. Canadian Pat. No. 751,084 (1967). Etching is permitted to continue until the deep diffusion zone 64 is entirely removed in the inter-contact regions 59—viz., the substrate is etched to a minimum depth at least equal to the depth of the deep diffusion zone 64 which is here, preferably, on the order of 0.5 μm, or greater, in depth with all substrate material in the broken-line cross-hatched regions 70 depicted in FIG. 8D being removed. Since hydrazine hydrate comprises a well-known texturizing etchant, the resulting etched inter-contact regions 59 are defined by a multiplicity of minute, randomly located, randomly sized pyramids 60 (FIGS. 8D and 8E; see, also, FIG. 10) which serve to optimize the light absorbing and collection efficiencies of the cell. Referring to FIGS. 8D and 10 conjointly, it will be noted that during the etching process, the etchant serves to undercut the substrate 56 in the contact areas 58 beneath the $SiO_2$ mask 68, thus forming relatively deep inclined surfaces 71 which, in effect, form inverted, truncated, V-shaped ridges 72 beneath the $SiO_2$ mask 68 in a fashion similar to that described in the aforesaid Rittner U.S. Pat. No. 4,135,950—although, with the process of the present invention the ridges contain the remnants of the deep diffusion layer 64 and are separated by texturized inter-contact regions 59.

Upon completion of the texturizing step (FIG. 8D), the substrate 56 is in the form depicted in FIG. 8E. As here shown, the substrate 56 is characterized by a plurality of raised contact areas 58 in the form of inverted, truncated, V-shaped ridges 72 spaced apart by texturized inter-ridge or inter-contact regions 59 which are, as yet, undoped. The truncated, inverted, V-shaped ridges 72 define raised, mesa-like, contact areas 58 which contain the deep diffusion layer 64 having high surface concentrations of n-type dopant and defining a deep n+—p junction 66. Moreover, the raised mesa-like contact areas 58 are dimensioned so as to permit ease of registration of masks (not shown) used during subsequent electrode vacuum deposition processes—i.e., the raised, flat, mesa-like contact areas 58 have a width sufficient to accommodate and permit of vacuum deposition of fine-line electrodes ranging in width from 0.5 mils to 1.0 mils. The substrate is now in readiness for a second gas diffusion doping process to form a shallow n+ diffusion layer in the texturized inter-ridge regions 59; and, such second gas diffusion process can be conducted either with the upper and lower $SiO_2$ masks 68 removed, as shown in FIGS. 8E and 8F, or with the masks 68 retained in place.

Although the process of the present invention is not, in its broader aspects, limited to the use of p-type substrates and n-type dopants or, for that matter, to gas diffusion doping processes, the present invention does find particularly advantageous use when forming a light transducer from a p-type substrate 56 utilizing an n-type dopant (such, for example, as phosphorous) in a high temperature gas diffusion process. Thus, it has been found that when the deep diffusion layer 64 is formed utilizing a gas diffusion process at relatively high temperatures on the order of 950° C. and higher and phosphorous as an n-type dopant, the diffusion process serves to getter undesired impurities and dislocations in the silicon substrate, with such impurities and dislocations gravitating into the deep diffusion layer 64, thereby substantially increasing minority carrier lifetime. Consequently, when the deep diffusion layer is entirely etched away during the preferential etching step (FIG. 8D) used to produce a texturized surface 60, such gettered impurities and dislocations are completely removed from the substrate 56; thereby permitting the use of inferior quality substrate materials at considerable raw material cost savings, with such inferior quality materials actually being upgraded in quality as a direct result of the high temperature gettering and subsequent etching operations.

Thus, while high temperature gas diffusion is employed primarily to form a deep n+ diffusion layer 64 and, while the use of a texturizing etchant is employed primarily to form a textured surface, when the two are used together in conjunction with a p-type substrate and phosphorous as a n-type dopant, a highly beneficial synergistic result is achieved—viz., undesired impurities and dislocations in the inferior quality substrate are first gettered and then entirely removed from the substrate resulting not only in the sought after improvements in both light collection and light-to-electrical energy conversion efficiencies but, also, in substantial improvement to the quality of the substrate, per se. Of course, those skilled in the art will appreciate that in some instances it is not desirable to incorporate textured photoactive inter-electrode regions in light-to-electrical energy transducers even though it is desirable to optimize the differential junction depths in the contact areas on the one hand (having relatively deep junctions on the order of 0.5 $\mu$m or greater in depth) and the inter-contact regions on the other hand (having relatively shallow junctions on the order of 0.3 $\mu$m±0.1 $\mu$m). In those cases employing the deep and shallow n+ −p junctions, the two-step n-type dopant diffusion process with an intermediate etch to entirely remove selected portions of the deep n+ −p junction, all in accordance with the present invention, readily permits the use of a non-texturizing etchant to produce polish etched inter-electrode regions. This, of course, permits optimization of the differential depth junctions and, at the same time, improvement in minority carrier lifetime by gettering undesired impurities and dislocations during the high temperature gas diffusion process for forming the deep junction with such gettered impurities and dislocations thereafter being entirely removed in the selective intermediate etching step, all irrespective of whether the etchant is a texturizing etchant or a polish etchant.

Referring now to FIG. 8F, the exemplary concentrator solar cell substrate 56 as thus far processed is now subjected to a second gas diffusion process to form a shallow n+ diffusion layer 65 in the inter-ridge texturized region 59 and defining a shallow n+ −p junction 67—such shallow diffusion layer 65 preferably being on the order of 0.3 $\mu$m±0.1 $\mu$m. For example, the desired shallow diffusion layer 65 can be obtained by subjecting the substrate to an n-type dopant in a gaseous carrier at temperature levels on the order of about 850° C. to about 875° C. for a period of from about 10 minutes to about 15 minutes. Since the shallow diffusion layer 65 is formed following the texturization step, the shallow diffusion layer is characterized by its essentially uniform depth; this notwithstanding the presence of the pyramid-like irregularities 60 in the texturized region 59—i.e., the shallow diffusion layer 65 assumes a cross-sectional configuration which generally conforms to the cross-sectional configuration of the textured surface 60. The thus prepared substrate 56 may now be cleaned prior to application of the upper and lower electrodes thereto.

Figure 8H:
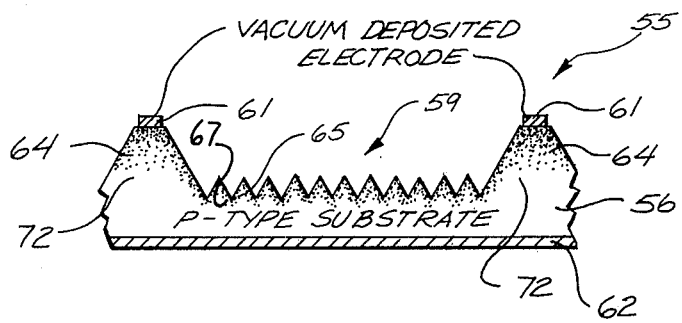
Figure 8I:
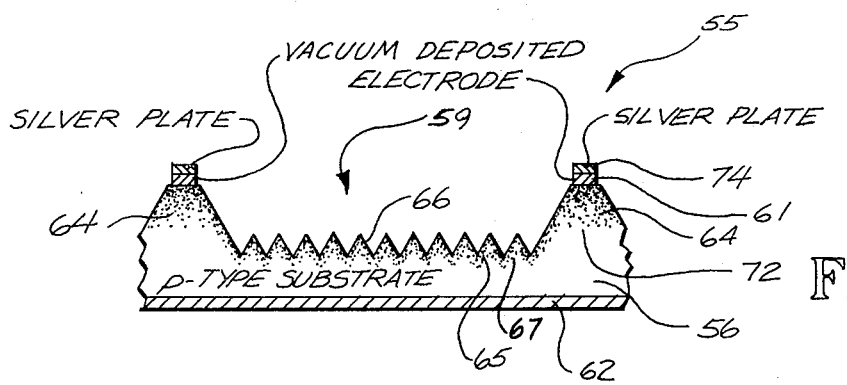
Figure 9:
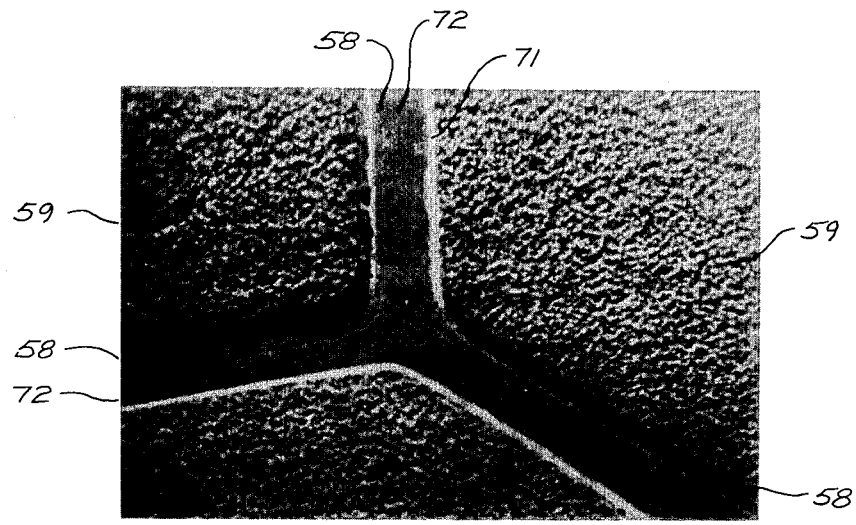
FIG. 9 is a highly magnified (700×) microphotograph taken at an oblique angle to the surface of the concentrator solar cell shown diagrammatically in FIG. 1, here illustrating a minute portion of the substrate at a point in the manufacturing process comparable to that shown diagrammatically in FIG. 8F—viz., following the double diffusion and intermediate texturizing processes but, prior to the application of vacuum deposited metallic electrodes—with the photograph here particularly illustrating that portion of the substrate wherein the radial mesa-like contact area branches; and, FIG. 10 is a highly magnified (3000×) microphotograph of a portion of the substrate surface shown in FIG. 9, here particularly illustrating the relationship of the raised mesa-like contact areas to the texturized surface which comprises a multiplicity of randomly located, randomly sized, minute pyramids produced in the texturizing step shown in diagrammatic form in FIGS. 8D and 8E.

Referring to FIG. 8G through 8I conjointly, it will be noted that the selectively texturized substrate 56 having shallow n+ diffusion layers 65 in the texturized regions 59 and deep n+ diffusion layers 64 in the raised mesa-like contact regions 58 may have both lower and upper electrodes affixed thereto in a conventional manner. Thus, in FIG. 8G the light transducer 55 is illustrated with the lower electrode 62 applied thereto; while in FIG. 8H, the transducer is illustrated with a vacuum deposited upper electrode 61 applied to the raised, mesa-like, contact areas 58 on the tops of the inverted, truncated, V-shaped ridges 72. It has been found that the presence of such raised, mesa-like, contact areas 58 greatly facilitates the successive mask alignments required in conventional photolithographic techniques when the electrodes 61 are vacuum deposited thereon, as can be readily observed upon inspection of the highly magnified microphotographs reproduced as FIGS. 9 and 10. Indeed, as previously indicated, the raised, flat, mesa-like, contact areas can be dimensioned so as to provide a smooth flat surface at least as wide as the fine-line, vacuum deposited electrode 61—i.e., electrodes which range in width from 0.5 mils to 1.0 mils—thereby permitting enhanced bonding between the electrodes and the substrate with consequent reduced electric resistance and, at the same time, minimizing the danger of short circuits resulting from migration of electrode metals through the shallow diffusion zone 65 since the electrodes can be precisely placed only on the contact areas 58 in proximity to the deep diffusion zone 64. Because vacuum deposited electrodes are used, tranducers formed in accordance with the present invention are characterized by low contact resistance between the electrodes and the silicon substrate surface. Such low contact resistance may be further reduced by subsequently plating the electrodes 61 with silver (as best indicated at 74 in FIG. 8I) in a conventional manner or, preferably, in the manner disclosed and claimed in the aforesaid copending application of Rudolph E. Corwin, Dietrich E. Reimer and Billy J. Stanbery, Ser. No. 169,756, filed July 17, 1980.

While the present invention has thus far been described in connection with gas diffusion dopant processes, those skilled in the art will appreciate that other conventional types of processes for dispersing impurity atoms into the near-surface regions of the substrate can be employed in lieu thereof. For example, the present invention is readily compatible with conventional ion implantation techniques well known to those skilled in the art and which permit of a high degree of control over the concentration profile of the diffusion layer—see, e.g., the article entitled "Ion Implantation for Semiconductor Devices" written by Robert J. Duchyiski, *Solid State Technology*, November, 1977 at pp. 53 through 58. In these relatively new, but conventional, techniques, precisely controlled quantities of dopant impurity atoms can be dispersed into the near-surface regions of a semiconductor substrate by ion bombardment at room temperature. When such conventional ion implantation techniques are utilized to form the impurity dispersion layers, it is generally desirable, and often necessary, to anneal the substrate either by thermal annealing or, preferably, by laser annealing in a manner well known to those skilled in the art. For example, a laser annealing process may be employed such as those disclosed in an article entitled "Laser Annealing of Ion-Implanted Semiconductors" written by C. W. White, J. Narayan and R. T. Young, Science, Vol. 204, No. 4392, May 4, 1979 at pp. 461 through 468. Annealing may take place prior to and/or subsequent to application of the electrodes 61, 62 and serves to substantially reduce radiation damage to solar cells and the like.

While ion implantation techniques may also be used to form the deep diffusion layer 64 in the contact regions 58, it is preferable that a high temperature—i.e., 950° C. or greater—gas diffusion process be employed when applying an n-type phosphorous dopant to a p-type substrate so as to permit gettering of undesired impurities and dislocations from the substrate and their subsequent removal during the intermediate etching step with either a texturizing etchant or a polish etchant, thereby substantially increasing minority carrier lifetimes. In either case, the impurity zones 64 formed are characterized by their thermal stability and, consequently, light tranducers and, especially, solar cells and concentrator solar cells, made in accordance with the present invention may be readily glass encapsulated, thereby greatly facilitating usage and prolonging the life thereof, and are particularly, but not exclusively, desirable for use in a wide range of space applications and the like.

What is claimed is:

1. The method of forming a light transducer having a plurality of contact areas and a plurality of photoactive areas from a wafer-like semiconductor substrate comprising the steps of:
   (a) dispersing dopant impurities into the near-surface region of the semiconductor substrate to form a deep dispersion layer having high surface concentrations of dopant impurities and having a chemical potential different from the chemical potential of the substrate;
   (b) masking selected regions of the substrate corresponding to the contact areas of the light transducer;
   (c) entirely removing the deep dispersion layer in the unmasked regions of the substrate corresponding to the photoactive regions of the light transducer while leaving raised mesa-like contact areas containing a deep dispersion layer of dopant impurities in the masked regions of the substrate;
   (d) dispersing dopant impurities into the near-surface regions of the substrate inter-contact regions of the light transducer to form a relatively shallow dispersion layer having relatively lower surface concentrations of dopant impurities and having a chemical potential different from the chemical potential of the substrate; and,
   (e) forming electrodes on the contact areas of the substrate.

2. The method as set forth in claim 1 wherein the semiconductor substrate is formed of p-type semiconductor material and the dopant impurities dispersed into the near-surface regions in steps (a) and (d) are n-type dopants.

3. The method as set forth in claim 1 wherein the semiconductor substrate is formed of n-type semiconductor material and the dopant impurities dispersed into the near-surface regions in steps (a) and (d) are p-type dopants.

4. The method as set forth in claim 1 wherein the deep dispersion layer is on the order of at least 0.5 $\mu$m in thickness.

5. The method as set forth in claims 1 or 4 wherein the shallow dispersion layer is on the order of 0.3 $\mu$m$\pm$0.1 $\mu$m in thickness.

6. The method as set forth in claim 1 wherein the dopant impurities are diffused into the near-surface regions by gas diffusion at a temperature in the range of: (i) about 950° C. to about 1000° C. for a period of from about 15 minutes to about 20 minutes in step (a); and (ii), about 850° C. to about 875° C. for a period of from about 10 minutes to about 15 minutes in step (d).

7. The method as set forth in claim 1 wherein the dopants dispersed into the near-surface regions of the substrate during at least step (d) are implanted therein by ion bombardment.

8. The method as set forth in claims 1 or 7 wherein the substrate is annealed following at least one of steps (d) and (e).

9. The method as set forth in claims 1 or 7 wherein the substrate is laser annealed following at least one of steps (d) and (e).

10. The method as set forth in claim 1 wherein the electrodes formed on the raised mesa-like contact areas in step (e) are formed by vacuum deposition.

11. The method as set forth in claims 1, 6 or 7 wherein the substrate is glass encapsulated following step (e).

12. The method as set forth in claim 1 wherein the substrate is annealed following at least one of steps (d) and (e) and is glass encapsulated following step (e).

13. The method as set forth in claim 1 wherein the substrate is laser annealed following at least one of steps (d) and (e) and is glass encapsulated following step (e).

14. The method of forming a light transducer having a pluarlity of contact areas and a pluarlity of photoactive areas from a wafer-like semiconductor substrate comprising the steps of:
   (a) dispersing dopant impurities into the nearsurface region of the semiconductor substrate to form a deep dispersion layer having high surface concentrations of dopant impurities and having a chemical potential different from the chemical potential of the substrate;
   (b) masking selected regions of the substrate corresponding to the contact areas of the light transducer;
   (c) etching the unmasked regions of the substrate with a texturizing etchant to:
      (i) entirely remove the deep dispersion layer in the unmasked regions of the substrate corresponding to the photoactive regions of the light transducer while leaving raised mesa-like contact areas containing a deep dispersion layer in the masked regions of the substrate; and,
      (ii) form a texturized completely undoped surface in the unmasked regions intermediate the raised mesa-like contact areas;
   (d) dispersing dopant impurities into the undoped near-surface regions of the substrate in the inter-contact regions of the light transducer to form a relatively shallow dispersion layer of substantially uniform depth on the irregular texturized surface and having relatively low surface concentrations of dopant impurities and a chemical potential different from the chemical potential of the substrate; and, (e) forming electrodes on the contact areas of the substrate.

15. The light transducer formed by the method set forth in the claim 14.

16. The method as set forth in claim 14 wherein the semiconductor substrate is formed of p-type semiconductor material and the dopant impurities dispersed into the nearsurface regions in steps (a) and (d) are n-type dopants.

17. The method as set forth in claim 14 wherein the semiconductor substrate is formed of n-type semiconductor material and the dopant impurities into the near-surface regions in steps (a) and (d) are p-type dopants.

18. The method as set forth in claims 14, 16 or 17 wherein the texturizing etchant used in step (c) is hydrazine hydrate and the texturized undoped surface formed is characterized by a multiplicity of randomly sized and located minute pyramids.

19. The method as set forth in claim 14 wherein the deep dispersion layer is on the order of at least 0.5 μm in thickness.

20. The method as set forth in claims 14 or 19 wherein the shallow dispersion layer is on the order of 0.3 μm±0.1 μm in thickness.

21. The method as set forth in claim 14 wherein the dopant impurities are diffused into the near-surface regions by gas diffusion at a temperature in the range of: (i) about 950° C. to about 1000° C. for a period of from about 15 minutes to about 20 minutes in step (a); and (ii), about 850° C. to about 875° C. for a period of from about 10 minutes to about 15 minutes in step (d).

22. The method as set forth in claim 14 wherein the dopants dispersed into the near-surface regions of the substrate during at least step (d) are implanted therein by ion bombardment.

23. The method as set forth in claim 14 or 22 wherein the substrate is annealed following at least one of steps (d) and (e).

24. The method as set forth in claims 14 or 22 wherein the substrate is laser annealed following at least one of steps (d) and (e).

25. The method as set forth in claim 14 wherein the electrodes formed on the mesa-like contact areas in step (e) are formed by vacuum deposition.

26. The method as set forth in claims 14, 21 or 22 wherein the substrate is glass encapsulated following step (e).

27. The method as set forth in claim 14 wherein the substrate is annealed following at least one of steps (d) and (e) and is glass encapsulated following step (e).

28. The method as set forth in claim 14 wherein the substrate is laser annealed following at least one of steps (d) and (e) and is glass encapsulated following step (e).

29. The method of forming a light transducer having a plurality of contact areas and a plurality of photoactive areas from a wafer-like p-type semiconductor substrate having a high percentage of undesired impurities and/or dislocations contained therein comprising the steps of:
(a) subjecting a surface of the substrate to a high temperature gas diffusion dopant process with an n-type dopant for a period sufficient to form a deep n+ diffusion layer in the near-surface regions of the substrate with undesired impurities and/or dislocations contained in the substrate being gettered into the relatively deep n+ diffusion layer and with the deep n+ diffusion layer having a chemical potential different from the chemical potential of the substrate;
(b) masking selected regions of the substrate corresponding to the contact areas of the light transducer;
(c) entirely removing the deep n+ diffusion layer, including the undesired impurities and/or dislocations contained therein, in the unmasked regions on the light transducer while leaving raised mesa-like contact areas containing a deep n+ diffusion layer in the masked regions of the substrate;
(d) dispersing n+ dopant impurities into the nearsurface regions of the substrate in the inter-contact regions of the light transducer to form a relatively shallow n+ dispersion layer having relatively lower surface concentrations of n+ dopant impurities and having a chemical potential different from the chemical potential of the substrate; and,
(e) forming electrodes on the contact areas of the substrate.

30. The method as set forth in claim 29 wherein the deep diffusion layer is on the order of at least 0.5 μm in thickness.

31. The method as set forth in claims 29 or 30 wherein the shallow dispersion layer is on the order of 0.3 μm±0.1 μm in thickness.

32. The method as set forth in claim 29 wherein the n-type dopant impurities are diffused into the near-surface regions by gas diffusion: (i) at a temperature on the order of at least 950° C. for a period on the order of at least 15 minutes in step (a); and (ii), at a temperature in the range of about 850° C. to about 875° C. for a period of from about 10 minutes to about 15 minutes in step (d).

33. The method as set forth in claim 29 wherein the n-type dopants dispersed into the near-surface regions of the substrate during step (d) are implanted therein by ion bombardment.

34. The method as set forth in claim 29 or 33 wherein the substrate is annealed following at least one of steps (d) and (e).

35. The method as set forth in claims 29 or 33 wherein the substrate is laser annealed following at least one of steps (d) and (e).

36. The method as set forth in claim 29 wherein the electrodes formed on the raised mesa-like contact areas in step (e) are formed by vacuum deposition.

37. The method as set forth in claims 29, 32 or 33 wherein the substrate is glass encapsulated following step (e).

38. The method as set forth in claim 29 wherein the substrate is annealed following at least one of steps (d) and (e) and is glass encapsulated following step (e).

39. The method as set forth in claim 29 wherein the substrate is laser annealed following at least one of steps (d) and (e) and is glass encapsulated following step (e).

40. The method as set forth in claim 29 wherein the unmasked regions of the deep n+ diffusion layer are entirely removed in step (c) by etching.

41. The method as set forth in claim 40 wherein a polish etchant is employed in step (c) to produce polish etched surfaces in the inter-contact regions of the substrate.

42. The method as set forth in claim 40 wherein a texturizing etchant is employed in step (c) to produce texturized surfaces in the inter-contact regions of the substrate.

43. The method as set forth in claim 42 wherein the texturizing etchant is hydrazine hydrate.

44. The method of forming a light transducer having a plurality of contact areas and a plurality of photoactive areas from a wafer-like p-type semiconductor substrate having a high percentage of undesired impurities and/or dislocations contained therein comprising the steps of:
  (a) subjecting a surface of the substrate to a high temperature gas diffusion dopant process with an n-type dopant for a period sufficient to form a deep n+ diffusion layer in the near-surface regions of the substrate with undesired impurities and/or dislocations contained in the substrate being gettered into the relatively deep n+ diffusion layer and with the deep n+ diffusion layer having a chemical potential different from the chemical potential of the substrate;
  (b) masking selected regions of the substrate corresponding to the contact areas of the light transducer;
  (c) etching the unmasked regions of the substrate with a texturizing etchant to:
    (i) entirely remove the deep n+ diffusion layer, including the undesired impurities and dislocations contained therein, in the unmasked regions of the substrate corresponding to the photoactive regions of the light transducer while leaving raised mesa-like contact areas containing a deep n+ diffusion layer in the masked regions of the substrate; and,
    (ii) form a texturized completely undoped surface in the unmasked regions intermediate the raised mesa-like contact areas;
  (d) dispersing dopant impurities into the undoped near-surface regions of the substrate in the inter-contact regions of the light transducer to form a relatively shallow n+ dispersion layer having relatively lower surface concentrations of n-type dopant impurities and having a chemical potential different from the chemical potential of the substrate; and,
  (e) forming electrodes on the contact areas of the substrate.

45. The light transducer formed by the method set forth in claim 44.

46. The method as set forth in claim 44 wherein the texturizing etchant used in step (c) is hydrazine hydrate and the texturized undoped surface formed is characterized by a multiplicity of randomly sized and located minute pyramids.

47. The method as set forth in claim 44 wherein the deep diffusion layer is on the order of at least 0.5 μm in thickness.

48. The method as set forth in claims 44 or 47 wherein the shallow dispersion layer is on the order of 0.3 μm±0.1 μm in thickness.

49. The method as set forth in claim 44 wherein the dopant impurities are diffused into the near-surface regions by gas diffusion: (i) at a temperature on the order of at least 950° C. for a period on the order of at least 15 minutes in step (a); and (ii), at a temperature in the range of about 850° C. to about 875° C. for a period of from about 10 minutes to about 15 minutes in step (d).

50. The method as set forth in claim 44 wherein the dopants dispersed into the near-surface regions of the substrate during step (d) are implanted therein by ion bombardment.

51. The method as set forth in claim 50 wherein the substrate is annealed following at least one of steps (d) and (e).

52. The method as set forth in claim 50 wherein the substrate is laser annealed following at least one of steps (d) and (e).

53. The method as set forth in claim 44 wherein the electrodes formed on the raised mesa-like contact areas in step (e) are formed by vacuum deposition.

54. The method as set forth in claims 44, 49 or 50 wherein the substrate is glass encapsulated following step (e).

55. The method as set forth in claim 44 wherein the substrate is annealed following at least one of steps (d) and (e) and is glass encapsulated following step (e).

56. The method as set forth in claim 44 wherein the substrate is laser annealed following at least one of steps (d) and (e) and is glass encapsulated following step (e).

57. An improved light transducer suitable for use as a solar cell comprising, in combination, a wafer-like semiconductor substrate, said substrate having: a first relatively deep dispersion layer of dopant impurities formed in the near-surface regions of said substrate with said deep dispersion layer having relatively high surface concentrations of dopant impurities and defining a relatively deep junction at the interface of said dispersion layer and said substrate defining regions of differing chemical potential in said substrate and in said dispersion layer; a plurality of spaced texturized surface areas formed on said substrate by complete removal of spaced areas of said first dispersion layer with a texturizing etchant and defining raised, spaced, mesa-like contact areas intermediate said spaced texturized surface areas; a second relatively shallow dispersion layer of dopant impurities formed in the near-surface regions of said texturized surface areas with said shallow dispersion layer having a substantially uniform depth and defining a relatively shallow junction at the interface of said shallow dispersion layer and said substrate defining regions of differing chemical potential in said substrate and said shallow dispersion layer; and, electrodes formed on said raised mesa-like contact areas and on the surface of said substrate remote from said raised contact areas.

58. The light transducer as set forth in claim 57 wherein said semiconductor substrate is formed of p-type semiconductor material and said deep and shallow dispersion layers are n+ layers formed from n-type dopants and defining n+—p junctions.

59. The light transducer as set forth in claim 57 wherein said semiconductor substrate is formed of n-type semiconductor material and said deep and shallow dispersion layers are p+ layers formed from p-type dopants and defining p+—n junctions.

60. The light transducer as set forth in claim 57 wherein said texturized surfaces are defined by a multiplicity of randomly sized and located, minute, pyramids.

61. The light transducer as set forth in claims 57, 58, 59 or 60 wherein said deep dispersion layer is on the order of at least 0.5 μm in thickness.

62. The light transducer as set forth in claims 57, 58, 59 and 60 wherein said shallow dispersion layer is on the order of 0.3 μm±0.1 μm in thickness.

63. The light transducer as set forth in claims 57, 58, 59 and 60 wherein said deep dispersion layer is on the order of at least 0.5 μm in thickness and said shallow dispersion layer is on the order of 0.3 μm±0.1 μm in thickness.

64. The light transducer as set forth in claims 48, 58, 59 or 60 wherein said transducer is glass encapsulated.

* * * * *